United States Patent [19]
Hirose

[11] Patent Number: 5,397,903
[45] Date of Patent: Mar. 14, 1995

[54] SEMICONDUCTOR SUBSTRATE FOR GETTERING

[75] Inventor: Koji Hirose, Tokyo, Japan

[73] Assignee: NEC Corporation, Tokyo, Japan

[21] Appl. No.: 10,335

[22] Filed: Jan. 28, 1993

[30] Foreign Application Priority Data

Jan. 31, 1992 [JP] Japan .................................. 4-17127

[51] Int. Cl.⁶ ..................... H01L 29/04; H01L 27/02; H01L 27/12; H01L 23/48
[52] U.S. Cl. ..................................... 257/51; 257/523; 257/524; 257/777; 257/74; 257/913; 437/10; 437/233
[58] Field of Search ................ 257/352, 505, 523, 524, 257/49, 51, 913, 777, 924; 437/233, 12, 10, 233

[56] References Cited

U.S. PATENT DOCUMENTS

| | | | |
|---|---|---|---|
| 3,192,398 | 6/1965 | Benedict | 257/523 |
| 3,894,893 | 7/1975 | Kabaya et al. | 148/175 |
| 4,053,335 | 10/1977 | Hu | 148/174 |
| 4,559,086 | 12/1985 | Hawkins | 148/1.5 |
| 5,189,508 | 2/1993 | Tachimori et al. | 257/913 |
| 5,238,875 | 8/1993 | Ogino | 437/225 |

FOREIGN PATENT DOCUMENTS

| | | | |
|---|---|---|---|
| 1926884 | 12/1969 | Germany | 257/505 |
| 3-743774 | 7/1989 | Germany | 257/74 |
| 62-216236 | 9/1987 | Japan . | |
| 3-132055 | 6/1991 | Japan . | |
| 4-273128 | 9/1992 | Japan . | |

OTHER PUBLICATIONS

Hammond, "Safety in Chemical Vapor Deposition", *Solid State Technology*, Dec. 1980, p. 104.
K. Susakabe, et al., "Specification of Polycrystal Silicon Backside Coated Wafer" *Jap. J. Appl. Phys.*, Fall, 1988 (30a-T-1), and English translation thereof.
Tan et al., "Intrinsic Gettering by Oxide Precipitate Induced Dislocations in Czochralski Si," *Applied Phys. Letters*, vol. 30, No. 4, Feb. 15, 1977, pp. 175–176.
*Solid–State Technoloyg (Japanese Version)*, vol. 11, Jan. 1981, p. 39.
Takino et al., "Annealing Effect of Mechanical Damage on Minute Defects, Heavy Metals and Oxygen Atoms in Silicon Crystals," *Semiconductor Silicon*, 1981, pp. 743–755.
Parekh, "Gettering of Gold and Its Influence on Some Transistor Parameters," *Solid–State Electronics*, vol. 13, 1970, pp. 1401–1406.
Kishino et al., "A Defect Control Technique for the Intrinsic Gettering in Silicon Device Processing," *Jpn. J. of Appl. Phys.*, vol. 23, No. 1, Jan. 1984, pp. L9–L11.

*Primary Examiner*—Sara W. Crane
*Assistant Examiner*—Teresa M. Arroyo
*Attorney, Agent, or Firm*—Burns, Doane, Swecker & Mathis

[57] ABSTRACT

Disclosed is a semiconductor device fabrication substrate having a getter site formed directly below the device fabrication region to allow gettering near the device fabrication region. A polycrystalline Si layer is deposited on the mirror-finished surface of a first monocrystalline Si wafer by vapor phase epitaxy. Then, the mirror-finished surface of a second monocrystalline Si wafer is brought into contact with the surface of the polycrystalline Si layer and are laminated with each other by heat treatment. Then, the top surface of the second monocrystalline Si wafer is subjected to grinding and mirror-finishing, so that the range from the mirror-finished surface to the polycrystalline Si layer may be on the order of several $\mu$m to several tens of $\mu$m. The resultant substrate has a getter layer (polycrystalline Si layer) directly below the device fabrication region.

1 Claim, 2 Drawing Sheets

DIFFUSION OF PHOSPHORUS

SEMICONDUCTOR SUBSTRATE FOR GETTERING

BACKGROUND OF THE INVENTION

1. Field of the Invention

The present invention relates to a semiconductor device fabrication substrate having a polycrystalline Si layer sandwiched between monocrystalline Si wafers.

2. Description of the Related Art

Heretofore, gettering treatments to remove harmful impurities include extrinsic gettering which gathers harmful impurities in a treatment-originated deformation layer, an impurity diffusion layer or a polycrystalline Si layer formed at the back of a wafer, as disclosed in, for example, Semiconductor Silicon (1981. pp. 743–755), Solid-State Electronics (Vol. 13, pp. 1401–1406, 1970) and Jpn. J. Appl. Phys., Fall 1988 (30a-t-1), and intrinsic gettering which captures and traps harmful impurities using precipitation of oxygen in the lattice in the wafer as disclosed in, for example, Solid-State Technology (Japanese Version, Vol. 11, p. 39, (1981)), Appl. Phys. Letters (30, 175 (1977)) and Jpn. J. of Appl. Phys. (23, L9 (1984)).

However, semiconductor device fabrication processing tends to involve a lower temperature for the diffusion heat treatment. As the temperature for the diffusion heat treatment gets lower, the diffusion range of harmful impurities, such as heavy metals, becomes smaller. Therefore, the conventional extrinsic gettering that does gettering from the back of a wafer, has a difficulty in gettering in the vicinity of the regions where semiconductor devices are fabricated (hereinafter referred to as "device fabrication regions"), resulting in an insufficient gettering effect. With the use of the intrinsic gettering, gettering near the device fabrication regions is possible by increasing the initial oxygen concentration to produce oxidation induced stacking fault with high concentration and build up the getter sites up to near the wafer surface. Due to poor controllabilities of oxidation induced stacking and of oxygen concentration, however, such stacking fault penetrates through the device fabrication regions, causing leakage.

SUMMARY OF THE INVENTION

The present invention was accomplished in view of the above problems. It is therefore an object of the present invention to provide a semiconductor device fabrication substrate which permits gettering in the vicinity of device fabrication region and prevents leakage from occurring due to the penetration of oxidation induced stacking fault throughout the device fabrication region.

To achieve this foregoing and other objects and in accordance with the purpose of the present invention, there is provided a semiconductor device fabrication substrate having a polycrystalline Si layer sandwiched between monocrystalline Si wafers.

Since the semiconductor device fabrication substrate embodying the present invention has a polycrystalline Si layer sandwiched between monocrystalline Si wafers, a twin is produced at the boundary between the polycrystalline Si layer and one of the monocrystalline Si wafers in the heat treatment in device fabrication processing. This twin boundary and the grain boundary of the polycrystalline Si layer serve as the getter site, so that the getter site can be provided directly under the device fabrication region. This ensures adequate gettering even if the diffusion heat treatment speed gets lower to reduce the diffusion range of harmful impurities.

DETAILED DESCRIPTION OF THE PREFERRED EMBODIMENTS

Preferred embodiments of the present invention will now be described specifically referring to the accompanying drawings.

FIGS. 1 through 4 are cross sections illustrating step by step the process for producing a semiconductor device fabrication substrate according to a first embodiment of the present invention. The semiconductor device fabrication substrate of this embodiment is described below based on this process.

Figure 1:
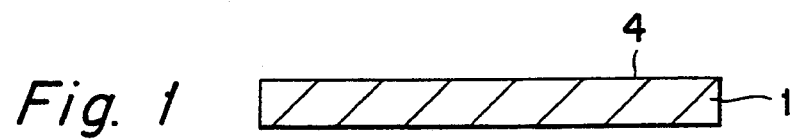
FIG. 1 is a cross section showing a step of working a first monocrystalline Si wafer in the process of producing a semiconductor device fabrication substrate according to a first embodiment of the present invention.

First, a first monocrystalline Si wafer 1 is sliced and one of its surfaces is mirror-finished to yield a mirror-finished surface 4, as shown in FIG. 1.

Figure 2:
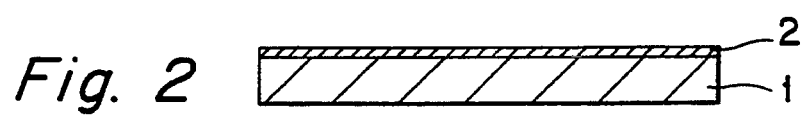
FIG. 2 is a cross section showing a step of vapor phase epitaxy of a polycrystalline Si layer in the same process.

Next, a polycrystalline Si layer 2 is deposited several μm thick on the mirror-finished surface 4 of the first monocrystalline Si wafer 1 by vapor phase epitaxy as shown in FIG. 2.

Figure 3:
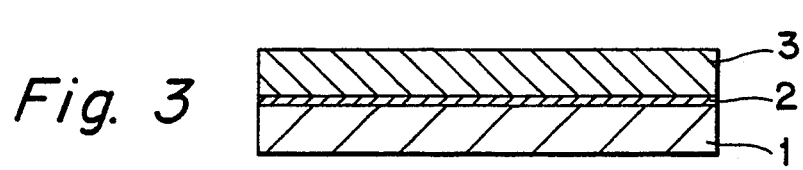
FIG. 3 is a cross section showing a step of laminating a second monocrystalline Si wafer onto the thus formed polycrystalline Si wafer in the same process.

Then, as shown in FIG. 3, a second monocrystalline Si wafer 3, which has been sliced with its one surface mirror-finished similarly, is placed, with the mirror-finished surface facing down, on the thus treated monocrystalline Si wafer 1 so that the mirror-finished surface of the second monocrystalline Si wafer 3 may be in contact with the surface of the polycrystalline Si layer 2 formed on the monocrystalline Si wafer 1, followed by heat-treatment at about 1000° C. As a result, the first monocrystalline Si wafer 1 having formed thereon the polycrystalline Si layer 2 and the second monocrystalline Si wafer 3 can be laminated with each other with the polycrystalline Si layer 2 being present therebetween.

Figure 4:
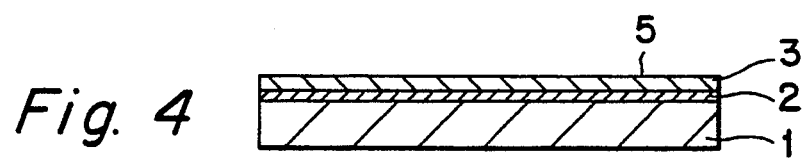
FIG. 4 is a cross section showing a step of grinding and mirror finishing in the same process.

Then, as shown in FIG. 4, the top surface of the second monocrystalline Si wafer 3 is subjected to grinding and mirror-finishing, making the monocrystalline Si wafer 3 thinner. As a result, the range from the mirror-finished surface 5 of the second monocrystalline Si wafer 3 to the polycrystalline Si layer 2 is on the order of several μm to several tens of μm.

According to this embodiment, due to the polycrystalline Si layer 2 interposed between the monocrystalline Si wafers 1 and 3, a twin is formed at the boundary between the polycrystalline Si layer 2 and the second monocrystalline Si wafer 3 in the heat treatment in device fabrication processing, and the inclination of the crystal grain boundary in the polycrystalline Si layer 2 increases. Accordingly, these twin boundary and grain boundary serve as the getter site. In addition, the range from the mirror-finished surface 5 of the second monocrystalline Si wafer 3 to the polycrystalline Si layer 2 where a semiconductor device is to be formed is designated to be on the order of several μm to several tens of μm, thus permitting gettering near the device fabrication regions.

Next, a second embodiment of the present invention is specifically described below referring to FIGS. 5 through 9.

FIGS. 5 through 9 are cross sections illustrating step by step a process for producing a semiconductor device fabrication substrate according to the second embodiment of the present invention.

Figure 5:
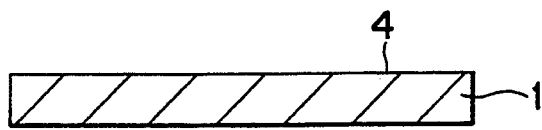
FIG. 5 is a cross section showing a step of working a first monocrystalline Si wafer in the process of producing a semiconductor device fabrication substrate according to a second embodiment of the present invention.

First, a first monocrystalline Si wafer 1 is sliced with its one surface mirror-finished to yield a mirror-finished surface 4, as shown in FIG. 5.

Figure 6:
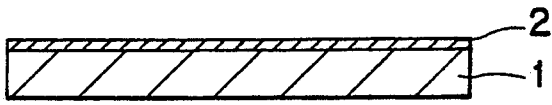
FIG. 6 is a cross section showing a step of vapor phase epitaxy of a polycrystalline Si layer in the same process.

Next, a polycrystalline Si layer 2 is deposited several μm thick on the mirror-finished surface 4 of the first monocrystalline Si wafer 1 by vapor phase epitaxy as shown in FIG. 6.

Figure 7:
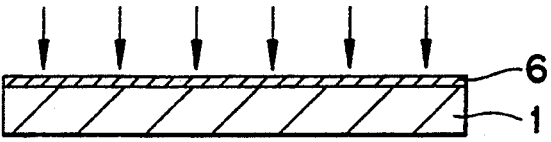
FIG. 7 is a cross section showing a step of forming an n+ polycrystalline Si layer in the same process.

Then, an n+ impurity, such as phosphorus (P), is diffused as shown in FIG. 7 so as to convert the polycrystalline Si layer 2 into an n+ polycrystalline Si layer 6.

Figure 8:
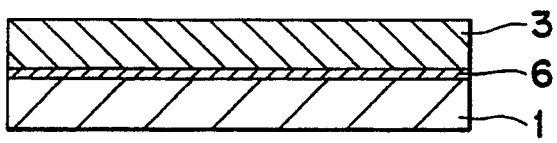
FIG. 8 is a cross section showing a step of laminating a second monocrystalline Si wafer to the thus formed polycrystalline Si wafer in the same process.
Figure 9:
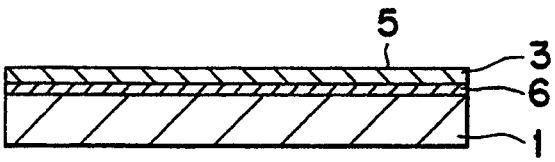
FIG. 9 is a cross section showing a step of grinding and mirror finishing in the same process.

Then, as shown in FIG. 8, a second monocrystalline Si wafer 3, which has been sliced with its one surface mirror-finished similarly, is placed on the n+ polycrystalline Si layer 6 in such a way that the mirror-finished surface 5 may be in contact with the surface of the n+ polycrystalline 6. The resultant laminate is heat-treated at about 1000° C. Thus, the first monocrystalline Si wafer 1 and the second monocrystalline Si wafer 3 can be laminated with each other with the n+ polycrystalline Si layer 6 present therebetween.

Next, the top surface of the second monocrystalline Si wafer 3 thus laminated is subjected to grinding and mirror-finishing such that the range from the mirror-finished surface 5 to the n+ polycrystalline Si layer 6 may be as thin as on the order of several μm to several tens of μm.

According to this embodiment, due to the n+ polycrystalline Si layer 6 interposed between the monocrystalline Si wafers 1 and 3, a twin is formed at the boundary between the second monocrystalline Si wafer 3 and the n+ poly-crystalline Si layer 6 in the heat treatment in device fabrication processing, and the inclination of the grain boundary in the n+ polycrystalline Si layer 6 increases. Accordingly, these twin boundary and grain boundary serve as the getter site. In addition, since the range from the mirror-finished surface 5 to the n+ polycrystalline Si layer 6 is designated to be on the order of from several μm to several tens of μm, gettering is possible in the vicinity of the device fabrication region. Further, due to the polycrystalline Si layer 2 which is converted to the n+ polycrystalline Si layer 6, this embodiment has a better getter effect than the first embodiment.

In short, according to the present invention, the getter site lie directly below the device fabrication region, permitting gettering in the vicinity of the device fabrication region, which is difficult by the conventional technique of gettering from the back of a wafer. Accordingly, even when the temperature for the diffusion heat treatment gets lower to reduce the diffusion range of harmful impurities, such as heavy metals, sufficient gettering is possible to yield high-quality semiconductor devices.

Further, since the present invention does not resort to oxidation induced stacking fault having poor controllability as the getter site, leakage attributable to the penetration of oxidation induced stacking faults throughout the device fabrication region is prevented, ensuring stable gettering that is not affected by variations in the initial oxygen concentration and the amount of oxidation induced stacking.

Furthermore, the getter sites cannot be a factor to cause leakage in this invention, so that the rate of the non-defectives in the device fabricating process improves, resulting in high yield.

What is claimed is:

1. A substrate for fabricating a semiconductor device comprising:
   a polycrystalline silicon layer sandwiched between monocrystalline silicon wafers,
   a first main surface of one of said monocrystalline silicon wafers being a surface on which semiconductor device fabrication regions are formed, and
   wherein said polycrystalline silicon layer provides a getter site directly under at least one of said semiconductor device fabrication regions and has first and second main surfaces opposite to each other, said one of said monocrystalline silicon wafers having a second main surface which is opposite to said first main surface thereof and is in contact directly with said first main surface of said polycrystalline silicon layer, and the other of said monocrystalline silicon wafers having a main surface which is in contact directly with said second main surface of said polycrystalline layer.

* * * * *